(12) United States Patent
Nishimura et al.

(10) Patent No.: US 10,527,648 B2
(45) Date of Patent: Jan. 7, 2020

(54) SEMICONDUCTOR INSPECTION DEVICE

(71) Applicant: Mitsubishi Electric Corporation, Tokyo (JP)

(72) Inventors: Misuzu Nishimura, Tokyo (JP); Yuya Saeki, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 396 days.

(21) Appl. No.: 15/434,593

(22) Filed: Feb. 16, 2017

(65) Prior Publication Data

US 2017/0336442 A1    Nov. 23, 2017

(30) Foreign Application Priority Data

May 19, 2016 (JP) ................................ 2016-100424

(51) Int. Cl.
*G01R 1/073* (2006.01)
*G01R 1/067* (2006.01)
*H01L 21/67* (2006.01)

(52) U.S. Cl.
CPC ..... *G01R 1/07314* (2013.01); *G01R 1/06722* (2013.01); *G01R 1/06727* (2013.01); *H01L 21/67288* (2013.01)

(58) Field of Classification Search
CPC ........ G01R 1/06; G01R 1/073; G01R 1/0491; G01R 1/07307; G01R 1/07314; G01R 1/07378; G01R 1/067; G01R 1/06794; G01R 1/06705; G01R 1/06711; G01R 1/06727; G01R 31/28; G01R 31/2887; G01R 31/2851; G01R 31/2893;

(Continued)

(56) References Cited

U.S. PATENT DOCUMENTS 4,590,422 A * 5/1986 Milligan ............ G01R 31/2886
                                                                134/6
5,968,282 A    10/1999 Yamasaka
(Continued)

FOREIGN PATENT DOCUMENTS

JP    H09-321102 A    12/1997
JP    H10-294343 A    11/1998
(Continued)

OTHER PUBLICATIONS

An Office Action mailed by the Korean Intellectual Property Office dated May 16, 2018, which corresponds to Korean Patent Application No. 10-2017-0059665 and is related to U.S. Appl. No. 15/434,593.

(Continued)

*Primary Examiner* — Son T Le
(74) *Attorney, Agent, or Firm* — Studebaker & Brackett PC

(57) ABSTRACT

According to the present invention, a semiconductor inspection device includes a control section that outputs a signal to inspect a semiconductor wafer, a contact section comprising contact terminals connected to the control section, a probe card that can simultaneously contact a plurality of semiconductor chips formed on the semiconductor wafer and a drive section, wherein the contact terminals can contact some of electrode pads provided for the probe card and the drive section drives the contact section so as to switch electrode pads in contact with the contact terminals.

12 Claims, 4 Drawing Sheets

(58) Field of Classification Search
CPC ............... G01R 31/2896; H01L 21/66; H01L 21/66288; H01L 21/822

See application file for complete search history.

(56) References Cited

U.S. PATENT DOCUMENTS

| | | | |
|---|---|---|---|
| 6,060,892 A * | 5/2000 | Yamagata | G01R 31/2887 324/754.07 |
| 6,075,373 A | 6/2000 | Iino | |
| 6,084,419 A | 7/2000 | Sato et al. | |
| 2004/0070961 A1 | 4/2004 | Haseyama | |
| 2008/0048685 A1* | 2/2008 | Chui | G01R 1/07314 324/754.07 |
| 2012/0212247 A1 | 8/2012 | Sakata et al. | |
| 2014/0139253 A1 | 5/2014 | Arita et al. | |
| 2014/0210500 A1 | 7/2014 | Akiyama et al. | |

FOREIGN PATENT DOCUMENTS

| | | |
|---|---|---|
| JP | H11-145219 A | 5/1999 |
| JP | 2005-317561 A | 11/2005 |
| JP | 2007-294489 A | 11/2007 |
| JP | 4794808 B2 | 10/2011 |
| JP | 5539033 B2 | 5/2014 |
| JP | 2014-145615 A | 8/2014 |
| WO | 2010/097841 A1 | 9/2010 |
| WO | 2012/172938 A1 | 12/2012 |

OTHER PUBLICATIONS

An Office Action; "Notice of Reasons for Refusal," issued by the Japanese Patent Office dated Mar. 19, 2019, which corresponds to Japanese Patent Application No. 2016-100424 and is related to U.S. Appl. No. 15/434,593; with English language translation.

* cited by examiner

SEMICONDUCTOR INSPECTION DEVICE

BACKGROUND OF THE INVENTION

Field

The present invention relates to a semiconductor inspection device and relates to a semiconductor inspection device suitable for use in a collective contact type semiconductor wafer measuring device.

Background

JP 2005-317561 A discloses a semiconductor inspection device using a probe card that can simultaneously contact a plurality of chips.

Semiconductor inspection device provided with a probe card which can simultaneously contact a plurality of chips needs to control many signals to inspect the plurality of chips. Thus, the semiconductor inspection device is mounted with many parts to control signals, which leads to an increase in size of the device.

SUMMARY

The present invention has been implemented to solve the above-described problem and it is an object of the present invention to provide a semiconductor inspection device that can downsize the device while using a probe card that can simultaneously contact a plurality of chips.

The features and advantages of the present invention may be summarized as follows.

According to the present invention, a semiconductor inspection device includes a control section that outputs a signal to inspect a semiconductor wafer, a contact section comprising contact terminals connected to the control section, a probe card that can simultaneously contact a plurality of semiconductor chips formed on the semiconductor wafer and a drive section, wherein the contact terminals can contact some of electrode pads provided for the probe card and the drive section drives the contact section so as to switch electrode pads in contact with the contact terminals.

Other and further objects, features and advantages of the invention will appear more fully from the following description.

DESCRIPTION OF EMBODIMENTS

Figure 1:
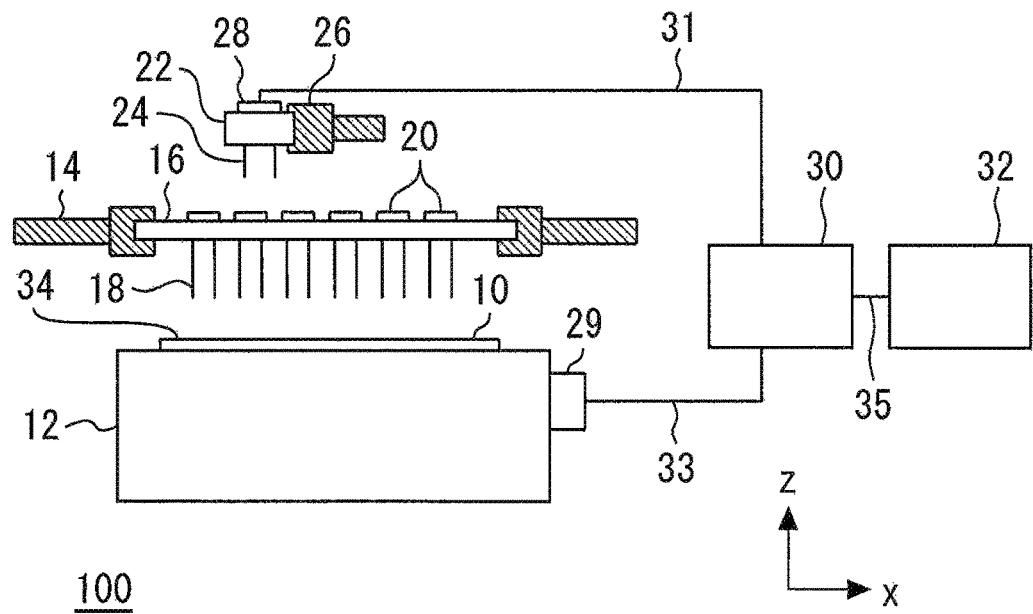
FIG. 1 is a schematic view of a semiconductor inspection device according to a first embodiment of the present invention.

A semiconductor inspection device according to an embodiment of the present invention will be described with reference to the accompanying drawings. Components identical or corresponding to each other are indicated by the same reference characters, and repeated description of them is avoided in some cases.

First Embodiment

FIG. 1 is a schematic view of a semiconductor inspection device 100 according to a first embodiment of the present invention. A semiconductor wafer 10 is placed on a top surface of a chuck stage 12. Semiconductor chips 34 are formed on the semiconductor wafer 10. A probe card 16 is disposed above the semiconductor wafer 10. The probe card 16 is fixed by a probe card support section 14. The probe card 16 is provided with contact probes 18 to contact the semiconductor chips 34. The contact probes 18 are made up of standing needles so as to be able to simultaneously contact all the semiconductor chips 34 formed on the semiconductor wafer 10. The probe card 16 includes electrode pads 20 on a top surface thereof. The respective contact probes 18 are connected to their corresponding electrode pads 20. Note that in FIG. 1, two contact probes 18 are connected to one electrode pad 20, but the number of contact probes connected is not limited to this. The number of contact probes 18 connected to each electrode pad 20 is one of design factors.

A contact section 22 is disposed above the probe card 16. The contact section 22 is supported by a drive section 26. The contact section 22 is provided with contact terminals 24. The contact terminals 24 are provided so as to be able to simultaneously contact the electrode pads 20 for measuring one of the semiconductor chips 34. The drive section 26 drives the contact section 22 in the X-, Y- and Z-axis directions. Note that the X-axis and Z-axis are coordinate axes shown in FIG. 1. The Y-axis is a coordinate axis perpendicular to the X-axis and Z-axis. The drive section 26 can drive the contact section 22 to rotate around the Z-axis.

The contact terminals 24 are connected to a test head 30 via the contact section 22, a connection section 28 and a signal line 31. The chuck stage 12 is connected to the test head 30 via a connection section 29 and a signal line 33. The test head 30 is connected to a control section 32 via a signal line 35. The test head 30 is a mechanism for connecting the signal lines 31, 33 and 35 between the contact terminals 24 and the control section 32, and between the chuck stage 12 and the control section 32. The control section 32 is a body part of a semiconductor tester and outputs a signal to inspect the semiconductor wafer 10.

The chuck stage 12, the probe card support section 14 and the probe card 16 constitute a wafer prober. The contact section 22, the drive section 26, the signal lines 31, 33 and 35, the connection sections 28 and 29, the test head 30 and the control section 32 constitute a semiconductor tester.

During an inspection, the semiconductor wafer 10 is placed on a top surface of the chuck stage 12. Next, the wafer prober causes the semiconductor wafer 10 to contact the probe card 16. At this time, the semiconductor chips 34 contact the contact probes 18 so that all the semiconductor chips 34 formed on the semiconductor wafer 10 can be measured. Next, the drive section 26 drives the contact section 22. As a result, the contact terminals 24 contact the electrode pads 20 to measure one of the semiconductor chips 34.

A conduction path for measuring electric characteristics of the semiconductor wafer 10 is formed in this way. The conduction path is formed in order of the top surface of the semiconductor wafer 10 as a starting point, the contact probes 18, the electrode pads 20, the contact terminals 24, the connection section 28, the signal line 31, the test head 30, the signal line 33, the connection section 29, the chuck stage 12, and the reverse side of the semiconductor wafer 10. Furthermore, the conduction path is formed in order of the test head 30, the signal line 35 and the control section 32. Note that as the conduction path, a case is assumed in the present embodiment where the semiconductor chip 34 is a longitudinal semiconductor such as an IGBT. As a modification of the present embodiment, the semiconductor chip 34 may be a horizontal semiconductor. In this case, signals may not need to be extracted from the reverse side of the wafer.

When measurement of one measurement chip is completed, the drive section 26 drives the contact section 22 to move. As a result, the contact terminals 24 contact the electrode pads 20 corresponding to the next measurement chip. In this case, the semiconductor wafer 10 and the contact probes 18 are kept in contact with each other. Therefore, it is possible to switch between measurement chips with the semiconductor wafer 10 and the contact probe 18 being kept in contact with each other.

When a semiconductor inspection device is constructed using a probe card which can simultaneously contact a plurality of semiconductor chips, a method may be considered which simultaneously connects the control section to all the electrode pads provided for the probe card. At this time, the semiconductor inspection device needs to control many signals. For this reason, the test head which is a signal connection mechanism needs to be provided with many relays to switch between signals. This results in an increase in the size of the device. Since the test head is provided with many relays, when trouble occurs in the relays, it is difficult to identify the trouble location.

In contrast, in the present embodiment, it is one semiconductor chip 34 that is measured by single contact between the contact terminals 24 and the electrode pads 20. Thus, the test head 30 is only required to be able to process signals to measure one chip. Therefore, the device can be constructed of fewer parts than when all the electrode pads 20 provided for the probe card 16 and the control section 32 are connected. For this reason, the semiconductor inspection device 100 can be downsized. Furthermore, when trouble occurs in the device, it is easier to identify the trouble location. The semiconductor inspection device 100 can also be constructed at lower cost.

Another method for downsizing the semiconductor inspection device may be use of a type of small probe card that contacts only one chip at a time. In this case, the semiconductor wafer and the probe card contact each other repeatedly for each chip so that measurement chips can be switched. When the semiconductor wafer and the probe card contact each other, surface heat of the semiconductor wafer is absorbed to the contact probe side. Therefore, the temperature of the wafer surface changes and a characteristic value varies. To prevent a variation in the characteristic value, a waiting time may be provided to make temperature stable for each contact. Providing a waiting time every time one chip is measured would increase the testing time.

In contrast, in the present embodiment, the contact section 22 moves, and measurement chips are thereby switched. When the measurement chips are switched, contact between the semiconductor wafer 10 and the probe card 16 is maintained. Therefore, when the measurement chips are switched, variations in an air flow and heat balance in space nearby the semiconductor wafer 10 are suppressed. Thus, the temperature variation of the semiconductor wafer 10 is suppressed. In this way, it is possible to shorten the waiting time for temperature stabilization. Therefore, the testing time can be shortened.

Since the temperature variation of the semiconductor wafer 10 is suppressed, it is possible to simplify a temperature adjustment function provided for the chuck stage 12. Therefore, the device can be downsized. Moreover, since the temperature variation of the semiconductor wafer 10 is suppressed, the characteristic value is stabilized. Therefore, the measuring accuracy can be improved. Moreover, when the measurement chips are switched by changing the position of the semiconductor wafer 10 for each chip, high contact accuracy is required. In contrast, in the present embodiment, the measurement chips can be switched by moving the small contact section 22. Therefore, the contact accuracy can be relaxed.

As the contact terminal 24 in the present embodiment, a spring probe, a wire probe, a laminated probe, a cantilever type probe or a ball grid can be used. Use of the spring probe or the cantilever type probe allows the contact terminal 24 to be configured at low cost. Use of the wire probe or the laminated probe allows the contact terminal 24 to have a longer service life. Use of the laminated probe allows the current flowing through the contact terminal 24 to have a higher current density. Use of the ball grid relaxes the contact accuracy required for contact between the contact terminal 24 and the electrode pad 20. In addition, any terminal can be used as the contact terminal 24 as long as it can secure conductivity through contact with the electrode pad 20.

The present embodiment assumes that one chip is measured by single contact between the contact terminals 24 and the electrode pads 20. As a modification thereof, a plurality of chips may be measured by single contact. In the present modification, the contact terminals 24 simultaneously contact the electrode pads 20 for measuring the plurality of semiconductor chips 34 to be measured. During measurement, measuring circuits are switched by a relay provided for the test head 30 to measure the plurality of chips.

The number of chips measured by single contact between the contact terminals 24 and the electrode pads 20 may be any number as long as the chips are some of the semiconductor chips 34. Note that when the number of chips measured by single contact is 4 or less, a commercially available product can be used as the test head 30 and the semiconductor inspection device 100 can be constructed at low cost. According to the present modification, it is possible to reduce the number of times measurement chips are switched and shorten the testing time.

In the present embodiment, it is assumed that the probe card 16 can simultaneously contact all the semiconductor chips 34 formed on the semiconductor wafer 10. As a modification thereof, the probe card 16 may simultaneously contact some of the semiconductor chips 34. In the present modification, it is possible to reduce the size of the probe card 16 compared to the case where the probe card 16 can simultaneously contact all the semiconductor chips 34.

Figure 2:
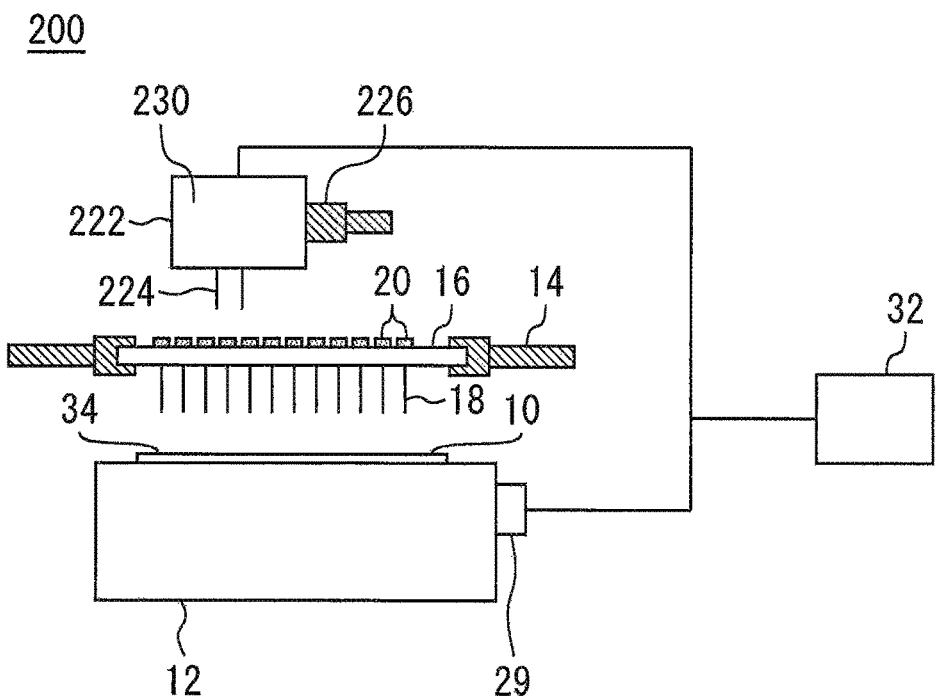
FIG. 2 is a schematic view of the semiconductor inspection device according to the modification of the first embodiment of the present invention.
Figure 3:
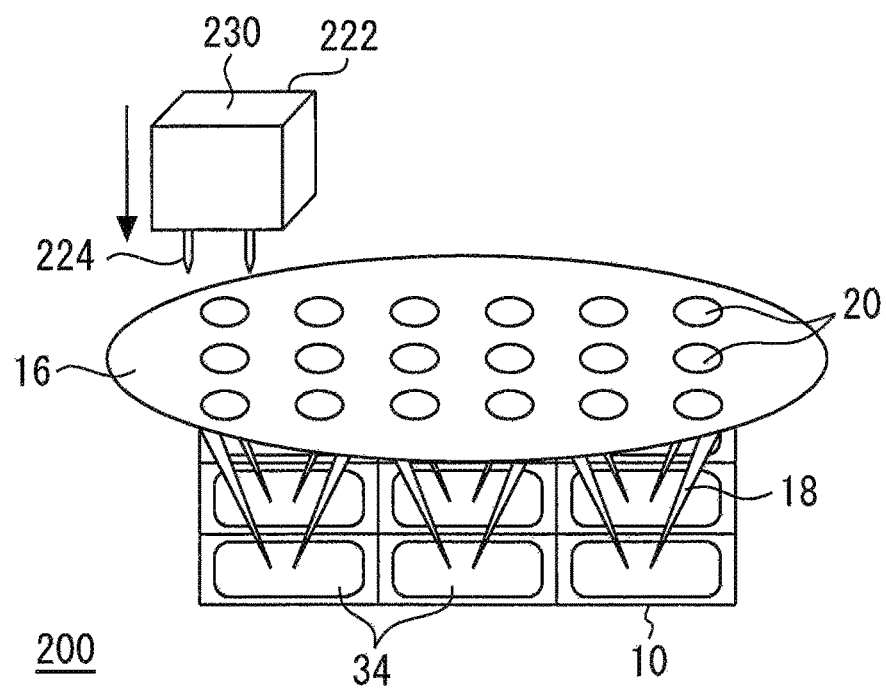
FIG. 3 is an enlarged view of a contact section and a probe card according to the modification of the first embodiment of the present invention.

FIG. 2 is a schematic view of the semiconductor inspection device according to the modification of the first embodiment of the present invention. FIG. 3 is an enlarged view of a contact section and a probe card according to the modification of the first embodiment of the present invention. In the semiconductor inspection device 100, the contact section 22 and the test head 30 are configured to be independent of each other. In contrast, in the semiconductor inspection device 200 of the present modification, a test head 230 is provided in a contact section 222. The contact section 222 and the test head 230 are integrated into one unit. Therefore, the drive section 226 drives the test head 230 together with the contact section 222.

According to the present modification, the contact section 222 and the test head 230 need not be provided separately. Therefore, the device configuration is simplified. In the present modification, it is assumed that the contact section 222 and the test head 230 are integrated into one unit. In contrast, the test head 230 may be detachably fixed to the contact section 222. Furthermore, in the present modification, the contact terminal 224 may be provided in the test head 230.

Second Embodiment

Figure 4:
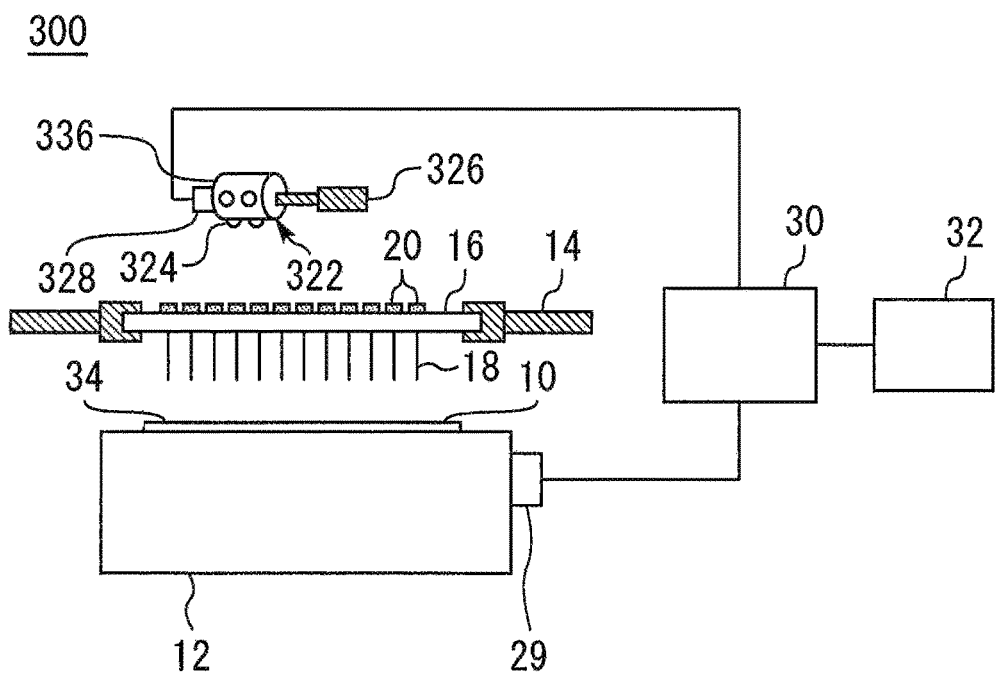
FIG. 4 is a schematic view of a semiconductor inspection device according to a second embodiment of the present invention.
Figure 5:
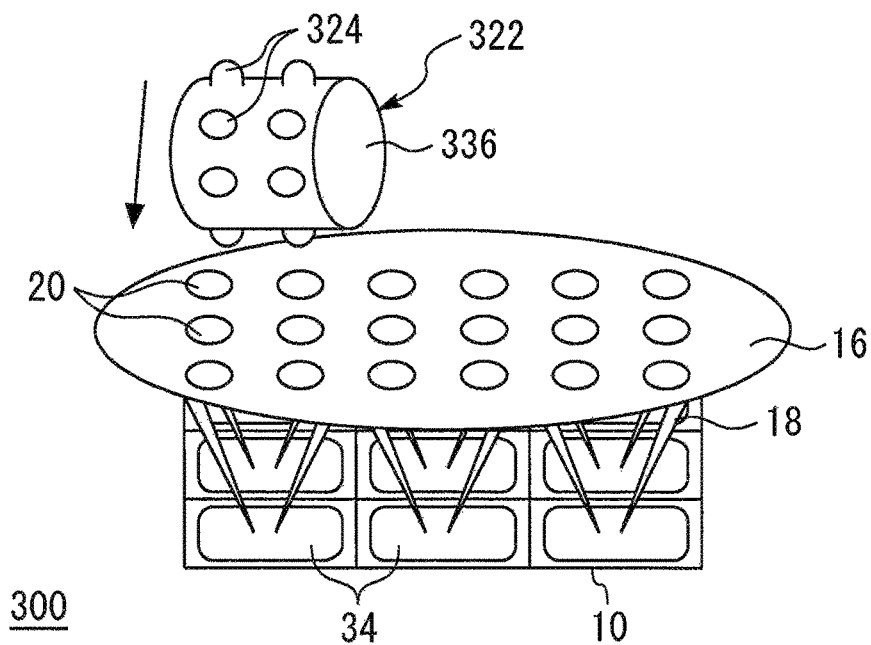
FIG. 5 is an enlarged view of a contact section and a probe card according to the second embodiment of the present invention.

FIG. 4 is a schematic view of a semiconductor inspection device according to a second embodiment of the present invention. FIG. 5 is an enlarged view of a contact section and a probe card according to the second embodiment of the present invention. A semiconductor inspection device 300 of the present embodiment is provided with a contact section 322. The contact section 322 is provided with a cylindrical roller 336. Contact terminals 324 are provided on a surface of the roller 336. A drive section 326 drives the roller 336 to rotate. In the present embodiment, as the roller 336 rotates, the electrode pads 20 that contact the contact terminals 324 are switched. Therefore, measurement chips are switched as the roller 336 rotates.

In the first embodiment, the following procedure is executed to switch between measurement chips. First, the contact section 22 is lifted so as to separate it away from the electrode pads 20. Next, the contact section 22 is moved to above the electrode pads 20 corresponding to the next measurement chip. Next, the contact section 22 is lowered so as to contact the electrode pads 20 again. In contrast, in the present embodiment, measurement chips are switched as the roller 336 rotates. It is thereby possible to shorten the time of switching measurement chips. In the present embodiment, the contact terminal 324 is a ball grid.

Third Embodiment

Figure 6:
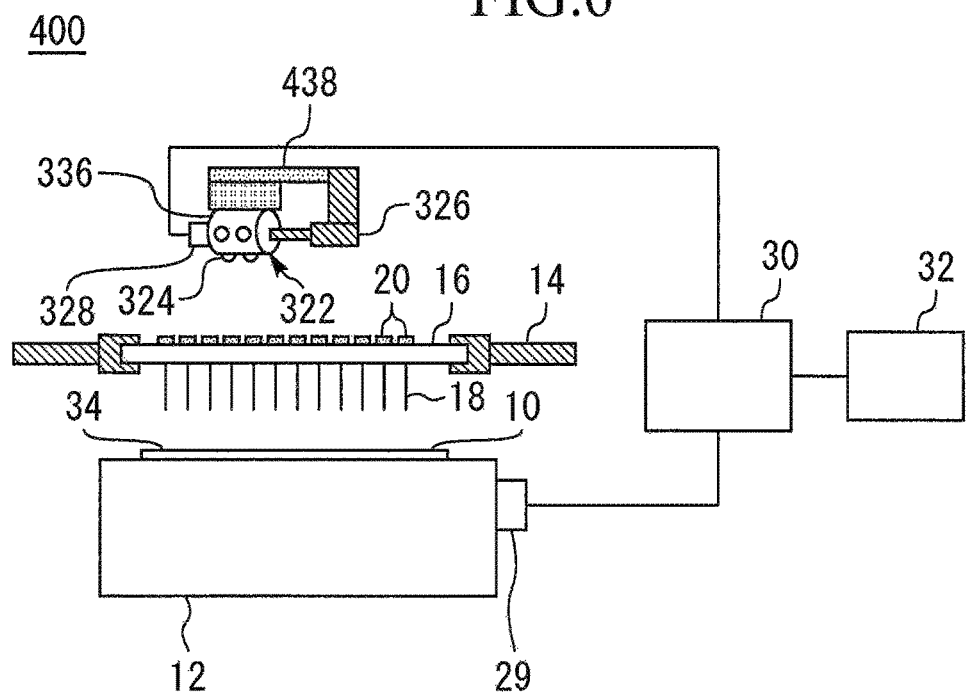
FIG. 6 is a schematic view of a semiconductor inspection device according to a third embodiment of the present invention.
Figure 7:
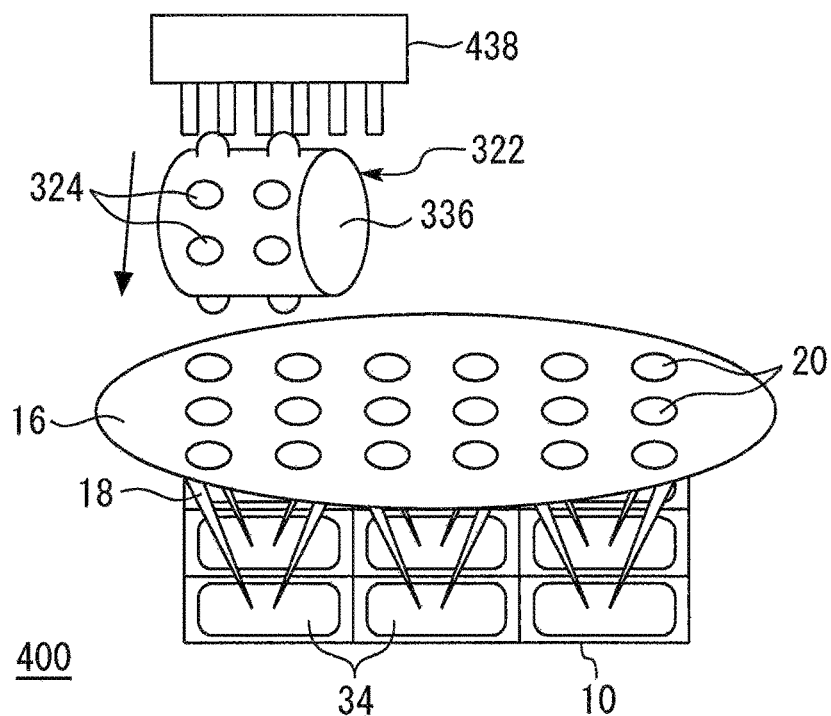
FIG. 7 is an enlarged view of a contact section and a probe card of the third embodiment of the present invention.

FIG. 6 is a schematic view of a semiconductor inspection device according to a third embodiment of the present invention. FIG. 7 is an enlarged view of a contact section and a probe card of the third embodiment of the present invention. The semiconductor inspection device 400 according to the present embodiment is provided with a cleaning tool 438 to clean the surface of the contact terminals 324 or the electrode pads 20. The cleaning tool 438 of the present embodiment is provided with a brush. As the material of the brush, resin or metal can be used.

Figure 8:
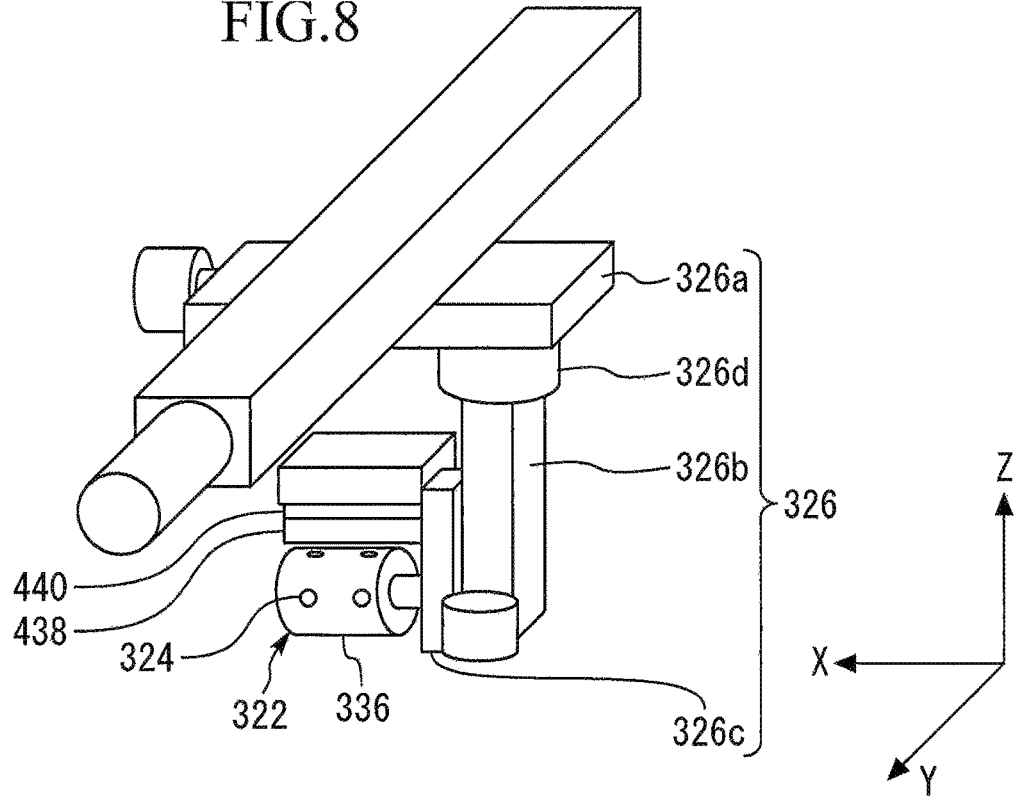
FIG. 8 is a perspective view of the drive section and the cleaning tool according to the third embodiment of the present invention.

FIG. 8 is a perspective view of the drive section and the cleaning tool according to the third embodiment of the present invention. The brush is disposed above the roller 336. As the roller 336 rotates, the contact terminals 324 are cleaned with the brush. In addition to the brush, a probe card polishing sheet, an absorption tape, an air cutter or a wipe can be used as the cleaning tool 438. In addition, any tool can be used as long as it can clean the surface. Furthermore, the cleaning tool 438 is provided with a dust collection nozzle 440.

The surfaces of the contact terminals 324 or the electrode pads 20 are cleaned with the cleaning tool 438. This can prevent contact failures between the contact terminals 324 and the electrode pads 20. The dust collection nozzle 440 absorbs dust generated by cleaning. The device can thereby be kept clean. As a modification of the present embodiment, the brush may be disposed on a side face of the roller 336. In this case, the dust collection nozzle 440 is disposed beneath the brush or the roller 336. According to this configuration, the dust collection nozzle 440 can collect dust generated by cleaning so as to receive dust below the brush or the roller 336. Dust can thereby be efficiently collected.

In the present embodiment, the semiconductor inspection device 400 is provided with the contact section 322. In contrast, the semiconductor inspection device 400 may also be provided with the contact section 22 or the contact section 222 shown in the first embodiment.

As shown in FIG. 8, the drive section 326 is provided with an X-axis drive section 326a, a Y-axis drive section 326b, a Z-axis drive section 326c and a θ-axis drive section 326d. The X-axis drive section 326a drives the contact section 322 in the X-axis direction. The Y-axis drive section 326b drives the contact section 322 in the Y-axis direction. The Z-axis drive section 326c drives the contact section 322 in the Z-axis direction. The θ-axis drive section 326d causes the contact section 322 to rotate around the Z-axis. The X-, Y- and Z-axes are coordinate axes shown in FIG. 8. As the drive section 326 drives the contact section 322 to move in the X, Y- and Z-axis directions and rotate around the Z-axis, the drive section 326 causes the electrode pads 20 and the contact terminals 324 to contact each other. The configuration shown in FIG. 8 is an example of the drive section 326 and the configuration of the drive section 326 is not limited to this. Note that the configuration of the drive section 326 is also applicable to the drive sections 26 and 226 shown in the first embodiment.

According to the wafer inspection device of the present invention, the contact terminals contact part of the electrode pads provided for the probe card, whereby the control section and the probe card are conductively connected. Furthermore, the drive section switches the electrode pads that contact the contact terminals. This configuration requires fewer signals for performing processing by single contact than a configuration in which the control section is connected to all the electrode pads provided for the probe card. Therefore, the device can be constructed of fewer parts. The size of the device can thereby be reduced.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2016-100424, filed on May 19, 2016 including specification, claims, drawings and summary, on which the Convention priority of the present application is based, are incorporated herein by reference in its entirety.

The invention claimed is:

1. A semiconductor inspection device comprising:
    a control section that outputs a signal to inspect a semiconductor wafer;

a contact section comprising contact terminals connected to the control section;

a probe card arranged between the contact section and the semiconductor wafer, wherein the probe card is configured to simultaneously contact a plurality of semiconductor chips formed on the semiconductor wafer arranged on a side of the probe card opposite to the contact section; and a drive section, wherein the contact terminals can contact some of electrode pads provided for the probe card, and the drive section is configured to drive the contact section so as to move the contact terminals to different electrode pads to switch measurement of semiconductor chips associated with the electrode pads while maintaining contact between the probe card and the semiconductor wafer.

2. The semiconductor inspection device according to claim 1, wherein the probe card can simultaneously contact all semiconductor chips formed on the semiconductor wafer.

3. The semiconductor inspection device according to claim 1, wherein the contact section comprises a test head to connect signal lines between the contact terminals and the control section.

4. The semiconductor inspection device according to claim 1, wherein the contact terminals simultaneously contact electrode pads to measure one semiconductor chip.

5. The semiconductor inspection device according to claim 1, wherein the contact terminals simultaneously contact electrode pads to measure a plurality of semiconductor chips.

6. The semiconductor inspection device according to claim 1, wherein the contact terminals are spring probes.

7. The semiconductor inspection device according to claim 1, wherein the contact terminals are wire probes.

8. The semiconductor inspection device according to claim 1, wherein the contact terminals are laminated probes.

9. The semiconductor inspection device according to claim 1, wherein the contact terminals are cantilever type probes.

10. The semiconductor inspection device according to claim 1, wherein the contact terminals are ball grids.

11. The semiconductor inspection device according to claim 1, wherein the contact section comprises a roller provided with contact terminals on a surface, and the drive section drives the roller to rotate so as to switch electrode pads in contact with the contact terminals.

12. The semiconductor inspection device according to claim 1, further comprising a cleaning tool to clean the contact terminals or the electrode pads.

* * * * *